US012062844B2

(12) United States Patent
Lee (10) Patent No.: US 12,062,844 B2
(45) Date of Patent: Aug. 13, 2024

(54) ANTENNA SYSTEM AND ANTENNA COMBINATION ARCHITECTURE

(71) Applicant: ASUSTeK COMPUTER INC., Taipei (TW)

(72) Inventor: Cheng-Tse Lee, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 197 days.

(21) Appl. No.: 17/887,626

(22) Filed: Aug. 15, 2022

(65) Prior Publication Data

US 2023/0077329 A1    Mar. 16, 2023

(30) Foreign Application Priority Data

Sep. 13, 2021   (TW) .................................. 110134113

(51) Int. Cl.
*H01Q 1/42*    (2006.01)
*H01L 23/00*   (2006.01)
(Continued)

(52) U.S. Cl.
CPC ............ *H01Q 1/422* (2013.01); *H01L 23/481* (2013.01); *H01L 23/535* (2013.01); *H01L 24/10* (2013.01);
(Continued)

(58) Field of Classification Search
CPC ............ H01Q 1/422; H01Q 1/38; H01Q 9/42; H01Q 1/2266; H01Q 13/18; H01Q 5/10; H01Q 5/20; H05K 9/0073; H05K 9/0081; H05K 9/0084; H01L 24/10–17; H01L 23/535; H01L 21/74; H01L 23/12–15
(Continued)

(56) References Cited

U.S. PATENT DOCUMENTS 9,397,387 B1      7/2016  Guterman et al.
10,498,041 B1 *  12/2019  Lin .................. H01Q 13/16
(Continued)

FOREIGN PATENT DOCUMENTS

AU   2010202586 A1 *  1/2011  ........... G06F 1/1616
CN   201623261 U      11/2010
(Continued)

*Primary Examiner* — Dameon E Levi
*Assistant Examiner* — Tan Minh Nguyen
(74) *Attorney, Agent, or Firm* — McClure, Qualey & Rodack, LLP (57) ABSTRACT

An antenna system is on a first conductor, spaced apart from a second conductor and includes a first dielectric substrate, and a first metal layer and a second metal layer. Many first conductive structures are connected to the first metal layer and the second conductor. Many second conductive structures are connected to the first metal layer and the second metal layer. A second dielectric substrate includes a third horizontal surface, a first vertical surface and a second vertical surface. A frequency adjustment portion is on the
(Continued)

third horizontal surface. A first matching portion and a second matching portion are on the second vertical surface. A first coupling distance is between the first matching portion and the first metal layer. A second coupling distance is between the second matching portion and the first metal layer. A signal source is connected to the second matching portion and the second metal layer.

22 Claims, 5 Drawing Sheets

(51) Int. Cl.
    *H01L 23/48*       (2006.01)
    *H01L 23/535*     (2006.01)
    *H01Q 1/22*        (2006.01)
    *H01Q 1/38*        (2006.01)
    *H01Q 5/10*        (2015.01)
    *H01Q 9/42*        (2006.01)
    *H01Q 13/18*      (2006.01)
    *H05K 9/00*        (2006.01)

(52) U.S. Cl.
    CPC .......... *H01L 24/11* (2013.01); *H01Q 1/2266* (2013.01); *H01Q 1/38* (2013.01); *H01Q 5/10* (2015.01); *H01Q 9/42* (2013.01); *H01Q 13/18* (2013.01); *H05K 9/0073* (2013.01); *H05K 9/0081* (2013.01); *H05K 9/0084* (2013.01)

(58) Field of Classification Search
    USPC .......................................................... 343/702
    See application file for complete search history.

(56) References Cited

U.S. PATENT DOCUMENTS

| | | | |
|---|---|---|---|
| 2011/0006953 A1* | 1/2011 | Chiang | H01Q 1/2266 343/702 |
| 2011/0050509 A1* | 3/2011 | Ayala Vazquez | H01Q 1/2266 343/702 |
| 2013/0050032 A1* | 2/2013 | Shiu | H01Q 1/2258 343/702 |
| 2016/0261022 A1* | 9/2016 | Guterman | H01Q 5/357 |
| 2018/0090840 A1* | 3/2018 | Yu | H01Q 21/064 |
| 2019/0237847 A1* | 8/2019 | Wu | H01Q 9/42 |
| 2021/0013182 A1* | 1/2021 | Reitmaier | H05K 3/4697 |
| 2022/0223996 A1* | 7/2022 | Chen | H01Q 1/2266 |
| 2022/0393337 A1* | 12/2022 | Liu | H01Q 19/10 |
| 2023/0072031 A1* | 3/2023 | Chen | H01Q 1/421 |

FOREIGN PATENT DOCUMENTS

| | | | | |
|---|---|---|---|---|
| CN | 105938382 B | | 5/2019 | |
| CN | 110178267 A | * | 8/2019 | ............. H01Q 1/243 |
| CN | 114256595 A | * | 3/2022 | |
| CN | 115810906 A | * | 3/2023 | ............. H01Q 1/241 |

* cited by examiner

ANTENNA SYSTEM AND ANTENNA COMBINATION ARCHITECTURE

CROSS-REFERENCE TO RELATED APPLICATION

This application claims the priority benefit of Taiwan application serial No. 110134113, filed on Sep. 13, 2021. The entirety of the above-mentioned patent application is hereby incorporated by reference herein and made a part of the specification.

BACKGROUND OF THE INVENTION

Field of the Invention

The disclosure relates to an antenna system and an antenna combination architecture including the antenna system.

Description of the Related Art

Built-in antennas generally used in notebook computers are mostly inverted-F antennas and monopole antennas. To enable the antenna to radiate well, the antenna usually needs to be placed in a non-metal clearance area of a specific size. If the computer is of an all-metal model, the space in which the antenna is located needs to be cut into a non-metal area by using mechanical manufacturing processes such as the plastic-metal dual-material injection technology or the plastic disassembly method. The method not only increases the production complexity and the production costs, but also significantly damages the product appearance of the industrial design.

BRIEF SUMMARY OF THE INVENTION

The disclosure provides an antenna system. The antenna system is located on a first conductor and is spaced apart from a second conductor. The antenna system includes a first dielectric substrate, a first metal layer, a second metal layer, a plurality of first conductive structures, a plurality of second conductive structures, a second dielectric substrate, a frequency adjustment portion, a first matching portion, a second matching portion, and a signal source. The first dielectric substrate includes a first horizontal surface and a second horizontal surface opposite to each other and is provided with an accommodating space. The first metal layer is located on the first horizontal surface, and the second metal layer is located on the second horizontal surface. The plurality of first conductive structures is electrically connected to the first metal layer and the second conductor, and the plurality of second conductive structures is electrically connected to the first metal layer and the second metal layer. The second dielectric substrate is located in the accommodating space and includes a third horizontal surface facing the second conductor and a first vertical surface and a second vertical surface opposite to each other. The frequency adjustment portion is located on the third horizontal surface and the first vertical surface, and a side edge of the frequency adjustment portion is electrically connected to the second metal layer. The first matching portion is located on the second vertical surface. There is a first coupling distance between one end of the first matching portion and the first metal layer, and the other end is electrically connected to the second metal layer. The second matching portion is located on the second vertical surface. There is a second coupling distance between one end of the second matching portion and the first metal layer. The signal source is electrically connected to the other end of the second matching portion and the second metal layer.

The disclosure further provides an antenna combination architecture, including a first conductor, a second conductor, and an antenna system. The antenna system is located on the first conductor and is spaced apart from the second conductor. The antenna system includes a first dielectric substrate, a first metal layer, a second metal layer, a plurality of first conductive structures, a plurality of second conductive structures, a second dielectric substrate, a frequency adjustment portion, a first matching portion, a second matching portion, and a signal source. The first dielectric substrate includes a first horizontal surface and a second horizontal surface opposite to each other and is provided with an accommodating space. The first metal layer is located on the first horizontal surface, and the second metal layer is located on the second horizontal surface. The plurality of first conductive structures is electrically connected to the first metal layer and the second conductor, and the plurality of second conductive structures is electrically connected to the first metal layer and the second metal layer. The second dielectric substrate is located in the accommodating space and includes a third horizontal surface facing the second conductor and a first vertical surface and a second vertical surface opposite to each other. The frequency adjustment portion is located on the third horizontal surface and the first vertical surface, and a side edge of the frequency adjustment portion is electrically connected to the second metal layer. The first matching portion is located on the second vertical surface. There is a first coupling distance between one end of the first matching portion and the first metal layer, and the other end is electrically connected to the second metal layer. The second matching portion is located on the second vertical surface. There is a second coupling distance between one end of the second matching portion and the first metal layer. The signal source is electrically connected to the other end of the second matching portion and the second metal layer.

In conclusion, the disclosure provides an antenna system and an antenna combination architecture, and adopts the concept of a resonant cavity, so that an antenna radiation signal is radiated well through an existing area in a housing, and no additional antenna clearance area is required. Therefore, the disclosure still has good antenna radiation characteristics on the premise of not damaging the product appearance design and requiring no additional non-metal clearance area. In addition, by means of the design of the frequency adjustment portion, the disclosure effectively reduces the minimum operating frequency of the antenna to effectively reduce the physical size of the antenna.

DETAILED DESCRIPTION OF THE EMBODIMENTS

Embodiments of the present disclosure are described with reference to relevant drawings. In the drawings, same or similar components or circuits are denoted by same reference numerals. It should be understood that the terms "first", "second", and the like used in this specification are used for describing various components, parts, areas, or structures, but such components, parts, areas and/or structures are not limited by the terms. The terms are used merely for distinguishing one component, part, area, or structure from another component, part, area, or structure.

Referring to FIG. 1, FIG. 2, FIG. 3, and FIG. 4 together, an antenna combination architecture 10 includes a first conductor 12, a second conductor 14, and an antenna system 16. The first conductor 12 and the second conductor 14 are disposed parallel to each other, and the first conductor 12 surrounds the second conductor 14. The first conductor 12 further includes an inner horizontal surface 121 and an inner vertical surface 122, so that there is a first distance d1 between the inner vertical surface 122 of the first conductor 12 and an edge of the second conductor 14, and the second conductor 14 further includes a horizontal surface 141.

Figures 4, 5:
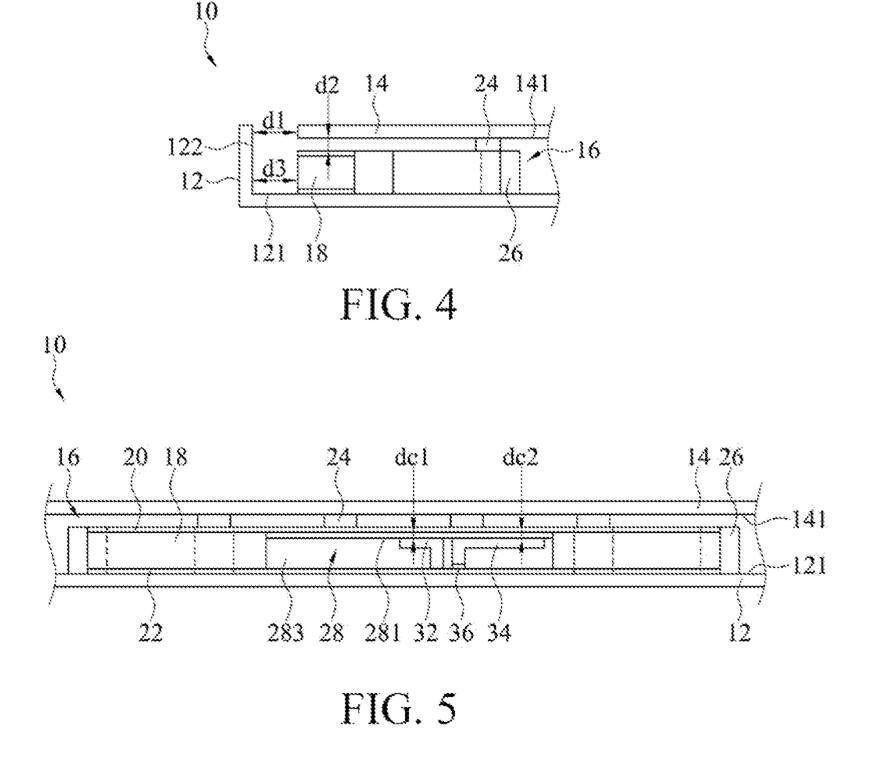
FIG. 4 is a schematic side view of an antenna combination architecture according to an embodiment of the disclosure.
FIG. 5 is a schematic side view of an antenna combination architecture from another field of view according to an embodiment of the disclosure.

As shown in FIG. 4, the antenna system 16 is located on the first conductor 12 and is spaced apart from the second conductor 14. In other words, the antenna system 16 is located on the inner horizontal surface 121 of the first conductor 12, so that there is second distance d2 between the antenna system 16 and the horizontal surface 141 of the second conductor 14, and there is a third distance d3 between the antenna system 16 and the inner vertical surface 122 of the first conductor 12.

In an embodiment in which an electronic device is a notebook computer, the first conductor 12 is a screen metal back cover of the notebook computer, and the second conductor 14 is a screen of the notebook computer. In addition, the first conductor 12 is alternatively a base cover body of the notebook computer, and the second conductor 14 is alternatively a keyboard metal cover of the notebook computer. Using an example in which the first conductor 12 is the screen metal back cover of the notebook computer and the second conductor 14 is the screen of the notebook computer, the first distance d1 is a screen non-display area between the screen and the screen metal back cover. In an embodiment, the first distance d1 is 4 mm, the second distance d2 is 1 mm, and the third distance d3 is 4 mm, which are used as an example in the disclosure.

In an embodiment, the third distance d3 is greater than or equal to the first distance d1, and is represented as d3≥d1.

Referring to FIG. 1 to FIG. 6 together, the antenna system 16 is substantially of a rectangular structure. The antenna system 16 includes a first dielectric substrate 18, a first metal layer 20, a second metal layer 22, a plurality of first conductive structures 24, a plurality of second conductive structures 26, a second dielectric substrate 28, a frequency adjustment portion 30, a first matching portion 32, a second matching portion 34, and a signal source 36.

Figure 3:
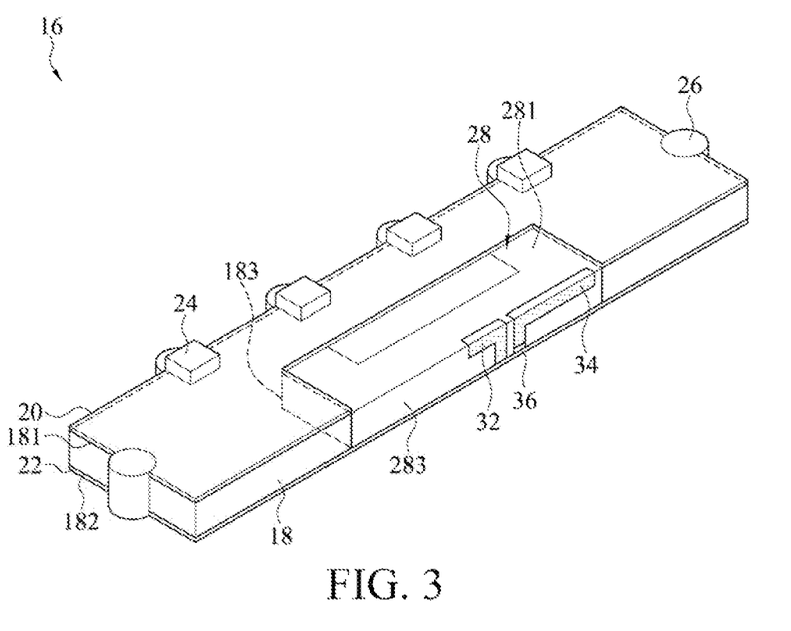
FIG. 3 is a schematic structural diagram of an antenna system according to an embodiment of the disclosure.

As shown in FIG. 3, the first dielectric substrate 18 includes a first horizontal surface 181 and a second horizontal surface 182 opposite to each other, and is provided with an accommodating space 183. The first metal layer 20 is located on the first horizontal surface 181 of the first dielectric substrate 18, and a maximum range of the first metal layer 20 does not exceed the first horizontal surface 181. The second metal layer 22 is located on the second horizontal surface 182 of the first dielectric substrate 18, and a maximum range of the second metal layer 22 does not exceed the second horizontal surface 182.

The plurality of first conductive structures 24 is electrically connected to the first metal layer 20 and the horizontal surface 141 of the second conductor 14, so that the first metal layer 20 is electrically connected to the horizontal surface 141 of the second conductor 14 through the first conductive structure 24. In an embodiment, the first conductive structure 24 is of a strip or sheet structure. The sheet structure such as a conductive foam is used as an example herein. The plurality of second conductive structures 26 is electrically connected to the first metal layer 20 and the second metal layer 22. In an embodiment, the second conductive structures 26 run through the first dielectric substrate 18 and are exposed from the first horizontal surface 181 and the second horizontal surface 182 to be electrically connected to the first metal layer 20 and the second metal layer 22. The second dielectric substrate 28 is located in the accommodating space 183 of the first dielectric substrate 18. The second dielectric substrate 28 includes a third horizontal surface 281 facing the second conductor 14 and a first vertical surface 282 and a second vertical surface 283 opposite to each other, and the second vertical surface 283 is disposed outwards and faces the inner vertical surface 122 of the first conductor 12.

Figure 6:
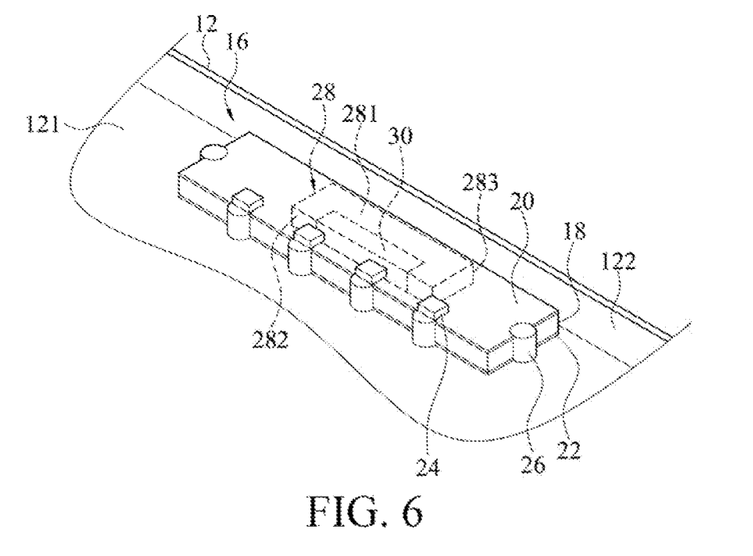
FIG. 6 is a schematic structural diagram of an antenna system from another field of view according to an embodiment of the disclosure.

As shown in FIG. 6, the frequency adjustment portion 30 is located on the third horizontal surface 281 and the first vertical surface 282 of the second dielectric substrate 28, and a side edge of the frequency adjustment portion 30 is electrically connected to the second metal layer 22 to be grounded, so that the size of the frequency adjustment portion 30 is adjusted to effectively reduce the minimum operating frequency of the antenna, thereby reducing the finishing size of the antenna system 16.

As shown in FIG. 5, the first matching portion 32 is located on the second vertical surface 283 of the second dielectric substrate 28. There is a first coupling distance dc1 between one end of the first matching portion 32 and the first metal layer 20, and the other end of the first matching portion 32 is electrically connected to the second metal layer 22, so that the size of the first matching portion 32 is adjusted to adjust the coupling amount between the first matching portion 32 and the first metal layer 20, thereby adjusting the antenna impedance matching. The second matching portion 34 is located on the second vertical surface 283 of the second dielectric substrate 28. There is a second coupling distance dc2 between one end of the second matching portion 34 and the first metal layer 20, so that the size of the second matching portion 34 is adjusted to adjust the coupling amount between the second matching portion 34 and the first metal layer 20, thereby adjusting the antenna impedance matching. One end of the signal source 36 is electrically connected to the other end of the second matching portion 34, and the other end of the signal source 36 is electrically connected to the second metal layer 22, to receive or transmit a radio frequency signal by using the signal source 36.

In an embodiment, the size of the antenna system 16 is 0.56 wavelength*0.15 wavelength*0.03 wavelength of the minimum operating frequency. If the minimum operating frequency of the antenna system 16 of the disclosure is designed to be 2.4 GHz, the corresponding size of the antenna system 16 is 67 mm*18 mm*4 mm.

Figure 7:
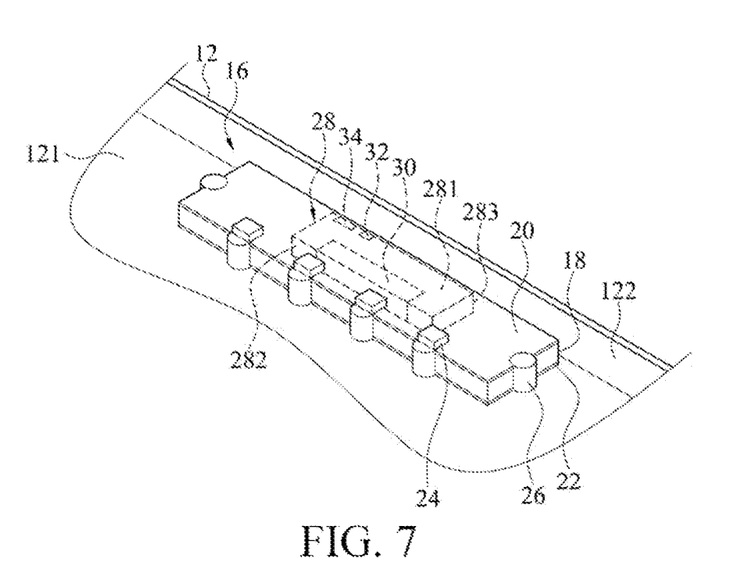
FIG. 7 is a schematic structural diagram of an antenna system according to another embodiment of the disclosure.

In another embodiment, as shown in FIG. 7, in the antenna system 16, the first matching portion 32 further extends to the third horizontal surface 281 of the second dielectric substrate 28 in addition to being located on the second vertical surface 283 of the second dielectric substrate 28, so that the size of the first matching portion 32 is adjusted to adjust the coupling amount between the first matching portion 32 and the first metal layer 20. The second matching portion 34 further extends to the third horizontal surface 281 of the second dielectric substrate 28 in addition to being located on the second vertical surface 283 of the second dielectric substrate 28, so that the size of the second matching portion 34 is adjusted to adjust the coupling amount between the second matching portion 34 and the first metal layer 20.

Figure 1:
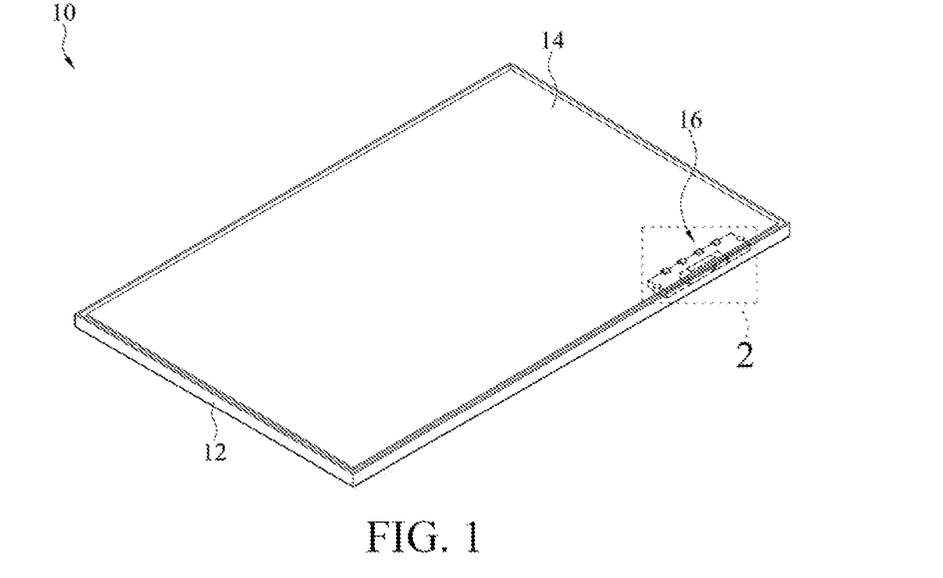
FIG. 1 is a schematic structural diagram of an antenna combination architecture according to an embodiment of the disclosure.
Figure 2:
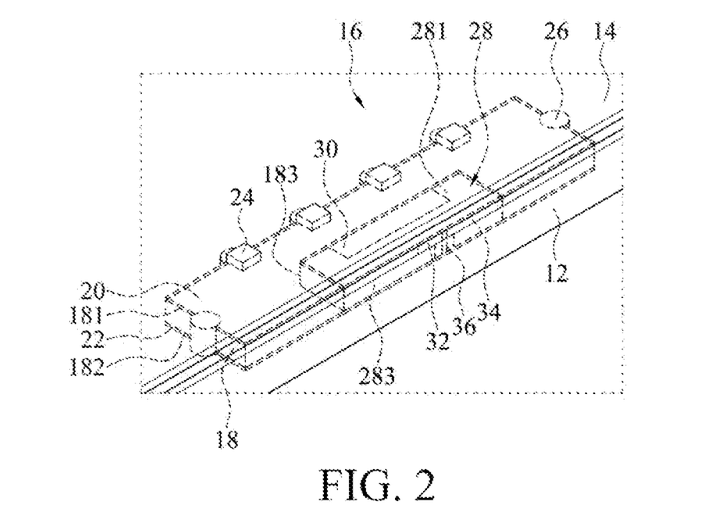
FIG. 2 is a schematic diagram of a partially enlarged structure of an antenna combination architecture according to an embodiment of the disclosure.

In an embodiment, as shown in FIG. 2, the first metal layer 20, the second metal layer 22, the second conductive structure 26, the frequency adjustment portion 30, the first matching portion 32, the second matching portion 34, and the like are made of conductive materials such as silver, copper, iron, aluminum, or alloys thereof.

Figure 8:
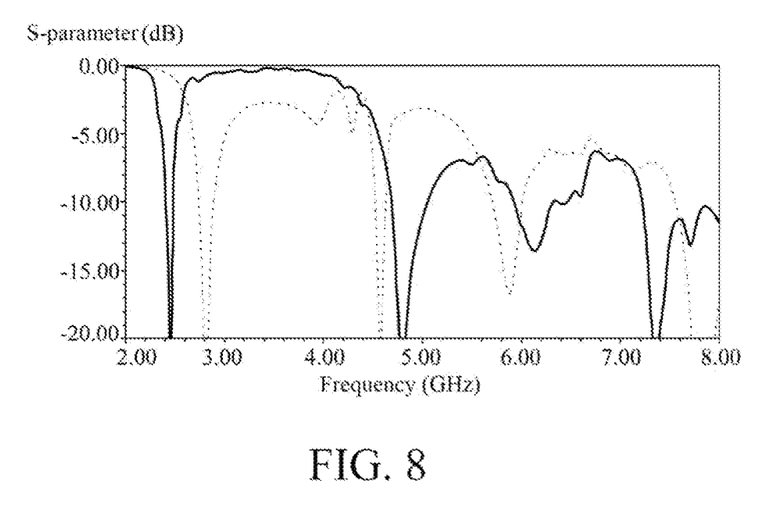
FIG. 8 is a schematic simulation diagram of an S parameter generated by an antenna system with a frequency adjustment portion and without a frequency adjustment portion at each frequency according to the disclosure.

The broadband antenna device provided in the disclosure indeed has a good return loss in a low-frequency operating band and a high-frequency operating band. Referring to FIG. 1 to FIG. 8 together, in the antenna combination architecture 10, the size of the entire antenna system 16 is 67 mm*18 mm*4 mm. When the radio frequency signal is transmitted, the designs of the antenna systems 16 including and not including the frequency adjustment portion 30 are compared, to perform simulation analysis of an S parameter (S11). When the antenna system operates at bands of 2.4 GHz, 5 GHz, and 6 GHz, simulation results of the S parameter are shown in FIG. 8, where a solid line represents an antenna system 16 including the frequency adjustment portion 30, and a dotted line represents an antenna system including no frequency adjustment portion. It is learned from the figure that the minimum operating frequency of the antenna system 16 is reduced from about 2.8 GHz to about 2.4 GHz, and antenna characteristics meet operating bandwidths required for the bands of 2.4 GHz, 5 GHz, and 6 GHz, that is, the band required for WiFi 6E. In addition, in the bands of 2.4 GHz, 5 GHz and 6 GHz, antenna resonance band reflection coefficients (S11) are less than −6 dB (S11<−6 dB), which proves that the antenna has good impedance bandwidths at the operating bands of 2.4 GHz, 5 GHz and 6 GHz. Therefore, the antenna system 16 of the disclosure has good impedance bandwidths at both the low-frequency operating band and the high-frequency operating band, which meets requirements of practical products.

The antenna system of the disclosure is applied to built-in antennas in the notebook computer, in an embodiment, in a vertical space between the screen and the screen metal back cover, or in a space between the base cover body and the keyboard metal cover. The disclosure adopts the concept of a resonant cavity to enclose a specific space area as a metal cavity which only radiates as an antenna in a specific direction. An antenna radiation signal is radiated well through an existing screen non-display area between the screen and the screen metal back cover. In addition, if the antenna is placed between the base cover body and the keyboard metal cover, only a slot of an appropriate size needs to be reserved, and the antenna system still radiates well.

In conclusion, the disclosure provides an antenna system and an antenna combination architecture, and adopts the concept of a resonant cavity, so that an antenna radiation signal is radiated well through an existing area in a housing, and no additional antenna clearance area is required. Therefore, the disclosure still has good antenna radiation characteristics on the premise of not damaging the product appearance design and requiring no additional non-metal clearance area. In addition, by means of the design of the frequency adjustment portion, the disclosure effectively reduces the minimum operating frequency of the antenna to effectively reduce the physical size of the antenna.

The foregoing embodiments are merely for describing the technical ideas and the characteristics of the disclosure, and are intended to enable a person skilled in the art to understand and implement the content of the disclosure. However, the scope of claims of the disclosure is not limited thereto. In other words, equivalent changes or modifications made according to the spirit disclosed in the disclosure shall still fall into the scope of claims of the disclosure.

What is claimed is:

1. An antenna system, located on a first conductor and spaced apart from a second conductor, wherein the antenna system comprises:
    a first dielectric substrate, comprising a first horizontal surface and a second horizontal surface opposite to each other and provided with an accommodating space;
    a first metal layer, located on the first horizontal surface;
    a second metal layer, located on the second horizontal surface;
    a plurality of first conductive structures, electrically connected to the first metal layer and the second conductor;
    a plurality of second conductive structures, electrically connected to the first metal layer and the second metal layer;
    a second dielectric substrate, located in the accommodating space and comprising a third horizontal surface facing the second conductor and a first vertical surface and a second vertical surface opposite to each other;
    a frequency adjustment portion, located on the third horizontal surface and the first vertical surface, wherein a side edge of the frequency adjustment portion is electrically connected to the second metal layer;
    a first matching portion, located on the second vertical surface, wherein there is a first coupling distance between one end of the first matching portion and the first metal layer, and the other end is electrically connected to the second metal layer;
    a second matching portion, located on the second vertical surface, wherein there is a second coupling distance between one end of the second matching portion and the first metal layer; and
    a signal source, electrically connected to the other end of the second matching portion and the second metal layer.

2. The antenna system according to claim 1, wherein the first conductor surrounds the second conductor, and the first conductor further comprises an inner horizontal surface and an inner vertical surface, so that there is a first distance between the inner vertical surface of the first conductor and the second conductor.

3. The antenna system according to claim 2, wherein the antenna system is located on the inner horizontal surface of the first conductor, there is a second distance between the antenna system and the second conductor, and there is a third distance between the antenna system and the inner vertical surface of the first conductor.

4. The antenna system according to claim 3, wherein the third distance is greater than or equal to the first distance.

5. The antenna system according to claim 1, wherein the plurality of second conductive structures run through the first dielectric substrate, and are exposed from the first horizontal surface and the second horizontal surface to be electrically connected to the first metal layer and the second metal layer.

6. The antenna system according to claim 1, wherein the first matching portion further extends to the third horizontal surface.

7. The antenna system according to claim 1, wherein the second matching portion further extends to the third horizontal surface.

8. The antenna system according to claim 1, wherein a maximum range of the first metal layer does not exceed the first horizontal surface.

9. The antenna system according to claim 1, wherein a maximum range of the second metal layer does not exceed the second horizontal surface.

10. The antenna system according to claim 1, wherein the first conductor is a screen metal back cover of an electronic device, and the second conductor is a screen of the electronic device.

11. The antenna system according to claim 1, wherein the first conductor is a base cover body of an electronic device, and the second conductor is a keyboard metal cover of the electronic device.

12. An antenna combination architecture, comprising:
a first conductor;
a second conductor; and
an antenna system, located on the first conductor and spaced apart from the second conductor, wherein the antenna system comprises:
a first dielectric substrate, comprising a first horizontal surface and a second horizontal surface opposite to each other and provided with an accommodating space;
a first metal layer, located on the first horizontal surface;
a second metal layer, located on the second horizontal surface;
a plurality of first conductive structures, electrically connected to the first metal layer and the second conductor;
a plurality of second conductive structures, electrically connected to the first metal layer and the second metal layer;
a second dielectric substrate, located in the accommodating space and comprising a third horizontal surface facing the second conductor and a first vertical surface and a second vertical surface opposite to each other;
a frequency adjustment portion, located on the third horizontal surface and the first vertical surface, wherein a side edge of the frequency adjustment portion is electrically connected to the second metal layer;
a first matching portion, located on the second vertical surface, wherein there is a first coupling distance between one end of the first matching portion and the first metal layer, and the other end is electrically connected to the second metal layer;
a second matching portion, located on the second vertical surface, wherein there is a second coupling distance between one end of the second matching portion and the first metal layer; and
a signal source, electrically connected to the other end of the second matching portion and the second metal layer.

13. The antenna combination architecture according to claim 12, wherein the first conductor surrounds the second conductor, and the first conductor further comprises an inner horizontal surface and an inner vertical surface, so that there is a first distance between the inner vertical surface of the first conductor and the second conductor.

14. The antenna combination architecture according to claim 13, wherein the antenna system is located on the inner horizontal surface of the first conductor, there is a second distance between the antenna system and the second conductor, and there is a third distance between the antenna system and the inner vertical surface of the first conductor.

15. The antenna combination architecture according to claim 14, wherein the third distance is greater than or equal to the first distance.

16. The antenna combination architecture according to claim 12, wherein the plurality of second conductive structures run through the first dielectric substrate, and are exposed from the first horizontal surface and the second horizontal surface to be electrically connected to the first metal layer and the second metal layer.

17. The antenna combination architecture according to claim 12, wherein the first matching portion further extends to the third horizontal surface.

18. The antenna combination architecture according to claim 12, wherein the second matching portion further extends to the third horizontal surface.

19. The antenna combination architecture according to claim 12, wherein a maximum range of the first metal layer does not exceed the first horizontal surface.

20. The antenna combination architecture according to claim 12, wherein a maximum range of the second metal layer does not exceed the second horizontal surface.

21. The antenna combination architecture according to claim 12, wherein the first conductor is a screen metal back cover of an electronic device, and the second conductor is a screen of the electronic device.

22. The antenna combination architecture according to claim 12, wherein the first conductor is a base cover body of an electronic device, and the second conductor is a keyboard metal cover of the electronic device.

* * * * *